(12) United States Patent
Tanaka et al.

(10) Patent No.: US 7,295,366 B2
(45) Date of Patent: Nov. 13, 2007

(54) OPTICAL INTEGRATED DEVICE AND OPTICAL MODULE

(75) Inventors: Shinsuke Tanaka, Kawasaki (JP); Ken Morito, Kawasaki (JP); Haruhiko Kuwatsuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/471,586

(22) Filed: Jun. 21, 2006

(65) Prior Publication Data

US 2007/0216996 A1  Sep. 20, 2007

(30) Foreign Application Priority Data

Mar. 15, 2006  (JP)  ............... 2006-070837

(51) Int. Cl.
*H01S 3/00*  (2006.01)

(52) U.S. Cl. .................................... 359/344

(58) Field of Classification Search ............... 359/344; 330/297
See application file for complete search history.

(56) References Cited

U.S. PATENT DOCUMENTS

| | | | |
|---|---|---|---|
| 5,386,310 A * | 1/1995 | Haneda et al. ............... 365/107 |
| 6,049,641 A * | 4/2000 | Deacon et al. ................ 385/15 |
| 6,238,100 B1 * | 5/2001 | Sasaki et al. ................. 385/59 |
| 6,323,717 B1 * | 11/2001 | Omura et al. ................ 327/434 |
| 6,597,497 B2 * | 7/2003 | Wang et al. .................. 359/344 |
| 6,678,432 B2 * | 1/2004 | Shigeta et al. ................ 385/14 |
| 6,747,793 B1 * | 6/2004 | Flanders ....................... 359/344 |
| 6,925,257 B2 * | 8/2005 | Yoo .............................. 398/47 |
| 7,046,434 B1 * | 5/2006 | DiJaili et al. ................ 359/344 |
| 7,058,248 B2 * | 6/2006 | Grubb et al. .................. 385/14 |
| 7,065,300 B1 * | 6/2006 | Walker ......................... 398/135 |

(Continued)

FOREIGN PATENT DOCUMENTS

JP  2000-208862  7/2000

OTHER PUBLICATIONS

K. Hamamoto, et al.; "Insertion-loss-free 1×4 optical switch fabricated using bandgap-energy-controlled selective MOVPE;" *Electronics Letters*; vol. 32; No. 24; Nov. 21, 1996; pp. 2265-2266./ Discussed in the specification.

(Continued)

*Primary Examiner*—Deandra M Hughes
(74) *Attorney, Agent, or Firm*—Kratz, Quintos & Hanson, LLP

(57) ABSTRACT

An optical integrated device includes a plurality of input optical waveguides connected respectively to a plurality of input ports provided on one end face of the optical integrated device, a single output optical waveguide connected to an output port, an optical coupler for optically coupling signal lights propagated along the plural input optical waveguides to the single output optical waveguide, and a semiconductor optical amplifier gate array formed from a plurality of semiconductor optical amplifiers provided on the input optical waveguides, respectively, and each having an electrode on the surface thereof. The optical integrated device further includes a plurality of signal lines formed on the surface of the optical integrated device in such a manner as to extend from the electrodes to an end face of the optical integrated device on which none of the input ports and the output port is provided.

11 Claims, 4 Drawing Sheets

U.S. PATENT DOCUMENTS

2004/0247233 A1* 12/2004 Grubb et al. .................. 385/14
2005/0089027 A1*  4/2005 Colton ........................ 370/380
2006/0104324 A1*  5/2006 Arimoto .................. 372/43.01
2006/0165363 A1*  7/2006 Kamiyama et al. ......... 385/132
2006/0215255 A1*  9/2006 Akiyama .................... 359/344

OTHER PUBLICATIONS

A. Lestra, et al.; "Monolithic Integration of Spot-Size Converters with 1.3- μm Lasers and 1.55- μm Poloarization Insensitive Semiconductor Optical Amplifers;" *IEEE Journal of Selected Topics in Quantum Electronics*; vol. 3; No. 6; Dec. 1997; pp. 1429-1440./ Discussed in the specification.

* cited by examiner

OPTICAL INTEGRATED DEVICE AND OPTICAL MODULE

CROSS REFERENCE TO RELATED APPLICATIONS

This application is based on and hereby claims priority to Japanese Application No. 2006-070837 filed on Mar. 15, 2006 in Japan, the contents of which are hereby incorporated by reference.

BACKGROUND OF THE INVENTION

1) Field of the Invention

This invention relates to an optical integrated device and an optical module suitable for use with an apparatus which includes, for example, a semiconductor optical amplifier (SOA) gate array switch.

2) Description of the Related Art

In recent years, in order to be ready for the network traffic which has been and is suddenly increasing, further increase of the capacity is required for a transmission apparatus such as a router or the like.

However, in an electric router apparatus (apparatus which exchanges and transmits data in the form of an electric signal) used at present, a limit to increase of the capacity is approached in terms of the processing speed and power consumption.

Therefore, a demand for an optical router apparatus (apparatus which exchanges and transmits data in the form of signal light) which allows further increase of the capacity is increasing.

In order to implement an optical router apparatus, a high-speed optical switch which switches signal light as it is at a high speed is required.

For example, as shown in FIG. 5, an SOA gate array switch 50 can change over an optical output thereof between on and off depending upon whether or not current is injected to a plurality of SOAs 51, and can perform switching at a high speed (on the nanosecond order). Therefore, the SOA gate array switch 50 is very promising as a high-speed optical switch.

As shown in FIG. 5, such an SOA gate array switch 50 as described above includes an SOA gate array device 52 including a plurality of SOAs 51, an optical fiber array 53, and an optical coupler 54.

Thus, by selectively injecting current only into one of the SOAs 51 in a state wherein signal light is inputted to all of the SOAs 51 of the SOA gate array device 52 (the SOA 51 to which current is applied is in an ON state), one of a plurality of input signal lights is selected and one output signal light is outputted through one of optical fibers which form the optical fiber array 53 (here, lens fiber array) and the optical coupler 54.

Incidentally, the SOA gate array device 52 is usually mounted in such a manner as described below.

First, the SOA gate array device (chip) 52 is bonded to a carrier with a junction face thereof directed upwardly.

Then, as shown in FIG. 6, electrodes of the SOAs 51 formed on the upper face of the SOA gate array device 52 and wirings formed on a wiring board 55 mounted in the proximity of a side face of the SOA gate array device 52 are electrically connected to each other by wire bonding so that current can be injected to each of the SOAs 51 which form the SOA gate array device 52.

Further, in order to optically connect an array optical waveguide which forms an optical input/output section of the SOA gate array device 52 and an external optical fiber array to each other, as shown in FIG. 6, lens arrays 56 (lens fiber arrays may be used instead) are individually mounted in the proximity of end faces of the SOA gate array device 52 on the optical input side and the optical output side, and the chip 52 and the lens arrays 56 are optically connected to each other.

It is to be noted that an example of a mounting method for an SOA gate array is disclosed, for example, in Alexis Lestra et al., "Monolithic Integration of Spot-Size Converters with 1.3-μm Lasers and 1.55-μm Polarization Insensitive Semiconductor Optical Amplifiers", IEEE JOURNAL OF SELECTED TOPICS IN QUANTUM ELECTRONICS, VOL. 3, No. 6, pp. 1429-1440, December 1997.

Meanwhile, a device structure is disclosed in K. Hamamoto et al., "Insertion-loss-free 1×4 optical switch fabricated using bandgap-energy-controlled selective MOVPE", ELECTRONICS LETTERS, Vol, 32, No. 24, pp. 2265-2266, 21 Nov. 1996 and Japanese Patent Laid-Open No. 2000-208862 wherein an SOA gate array, an optical divider or an optical multiplexer/demultiplexer and optical waveguides are monolithically integrated on the same semiconductor substrate.

Incidentally, as described above, when an SOA gate array device is to be mounted, it is necessary to mount the lens arrays 56, for example, at a distance of 1 mm or less adjacent the opposite ends of the SOA gate array device 52 having a size of, for example, 1 mm or less in order to establish optical connection to optical fiber arrays as seen in FIG. 6. Also it is necessary to establish uniform and good optical coupling between a plurality of lenses which form the lens arrays 56.

Further, in order to inject current into the plural SOAs 51, it is necessary to electrically connect the electrodes of the SOAs 51 and the wirings formed on the wiring board 55 to each other using a plurality of wires 57 having lengths different from each other.

Such a mounting work for moduling as described above is very cumbersome.

Particularly, where the number of channels increases, it is necessary to lay a great number of wires 57 in the limited space sandwiched by the lens arrays 56 (or lens fiber arrays) mounted on the opposite ends of the device. Therefore, interference between the wires, interference between the wires 57 and the lens arrays 56, increase of the inductance caused by elongation of the wires 57 and so forth make problems.

On the other hand, if such a configuration as described in the article "Insertion-loss-free 1×4 optical switch fabricated using bandgap-energy-controlled selective MOVPE" and Japanese Patent Laid-Open No. 2000-208862 as mentioned hereinabove is adopted, then the length of the device increases and the number of optical connections (optical couplings) is decreased to 1 (1 channel) which is on one side of the device. Therefore, the space for performing wire bonding is expanded, and also interference between wires can be suppressed. Further, since the number of optical couplings is 1 on one side of the device, the work for establishing optical coupling is comparatively facilitated.

However, the subject that, where the number of channels increases, the length of wires increases and the inductance increases cannot be solved. Further, since the lengths of the wires connected to the electrodes of the SOAs are different from each other, the variation in electric characteristic (such as, for example, impedance or the like) is great. Therefore, there is another subject that, where the SOAs are driven by a common driver circuit, uniform and good optical gate characteristics and high-speed electric signal characteristics cannot be achieved.

SUMMARY OF THE INVENTION

The present invention provides an optical integrated device and an optical module wherein increase of the inductance by wires can be suppressed and the variation in electric characteristic between electric wirings connected to electrodes of SOAs can be suppressed to a level lower than that of conventional optical integrated devices and optical modules.

One aspect of the present invention can provide an optical integrated device comprising a plurality of input optical waveguides connected respectively to a plurality of input ports provided on one end face of the optical integrated device, a single output optical waveguide connected to an output port, an optical coupler for optically coupling signal lights propagated along the plural input optical waveguides to the single output optical waveguide, a semiconductor optical amplifier gate array formed from a plurality of semiconductor optical amplifiers provided on the input optical waveguides, respectively, and each having an electrode on the surface thereof, and a plurality of signal lines formed on the surface of the optical integrated device in such a manner as to extend from the electrodes to an end face of the optical integrated device on which none of the input ports and the output port is provided.

Preferably, the output port is provided on an end face of the optical integrated device opposite to the one end face on which the input ports are provided. Further, a semiconductor optical amplifier is preferably provided on the output optical waveguide for amplifying output signal light.

Another aspect of the present invention can provide an optical module comprising the optical integrated device described above, a lens array formed from a plurality of lenses, and a wiring board having a plurality of wirings thereon, the lens array being arranged at a position opposed to the one end face of the optical integrated device such that the lenses are optically connected to the input ports, respectively, the wiring board being arranged at a position opposed to an end face of the optical integrated device on which none of the input ports and the output port is provided.

Preferably, the optical integrated device described above is configured such that the output optical waveguide includes a curved waveguide, the input ports and the output port being provided in such a manner as to line up in series along the one end face, the signal lines being formed in such a manner as to have an equal length and extend to an end face of the optical integrated device opposite to the one end face.

Further aspect of the present invention can provide an optical module comprising the optical integrated device having the preferable form just described, a lens array formed from a plurality of lenses, and a wiring board having a plurality of wirings thereon, the lens array being arranged at a position opposed to the one end face of the optical integrated device such that one of the lenses which form the lens array is optically connected to the single output port and the lenses other than the one lens are optically connected to the input ports, respectively, the wiring board being arranged at a position opposed to an end face of the optical integrated device opposite to the one end face.

Accordingly, with the optical integration device and the optical module of the above aspects of the present invention, there are advantages that increase of the inductance by wires can be suppressed and that the dispersion in electric characteristic between the electric wirings connected to electrodes of SOAs can be suppressed to a level lower than that of the conventional optical integration device and optical module.

The above and other aspects and advantages of the present invention will become apparent from the following description and the appended claims, taken in conjunction with the accompanying drawings in which like parts or elements are denoted by like reference characters.

DESCRIPTION OF THE PREFERRED EMBODIMENTS

In the following, an optical integrated device and an optical module according to embodiments of the present invention are described with reference to the drawings.

First Embodiment

First, an optical integrated device and an optical module according to a first embodiment of the present invention are described with reference to FIGS. 1 to 3.

In the following, the present invention is described taking a case wherein it is applied, for example, to a semiconductor optical amplifier (SOA) gate array switch as an example.

Figure 1:
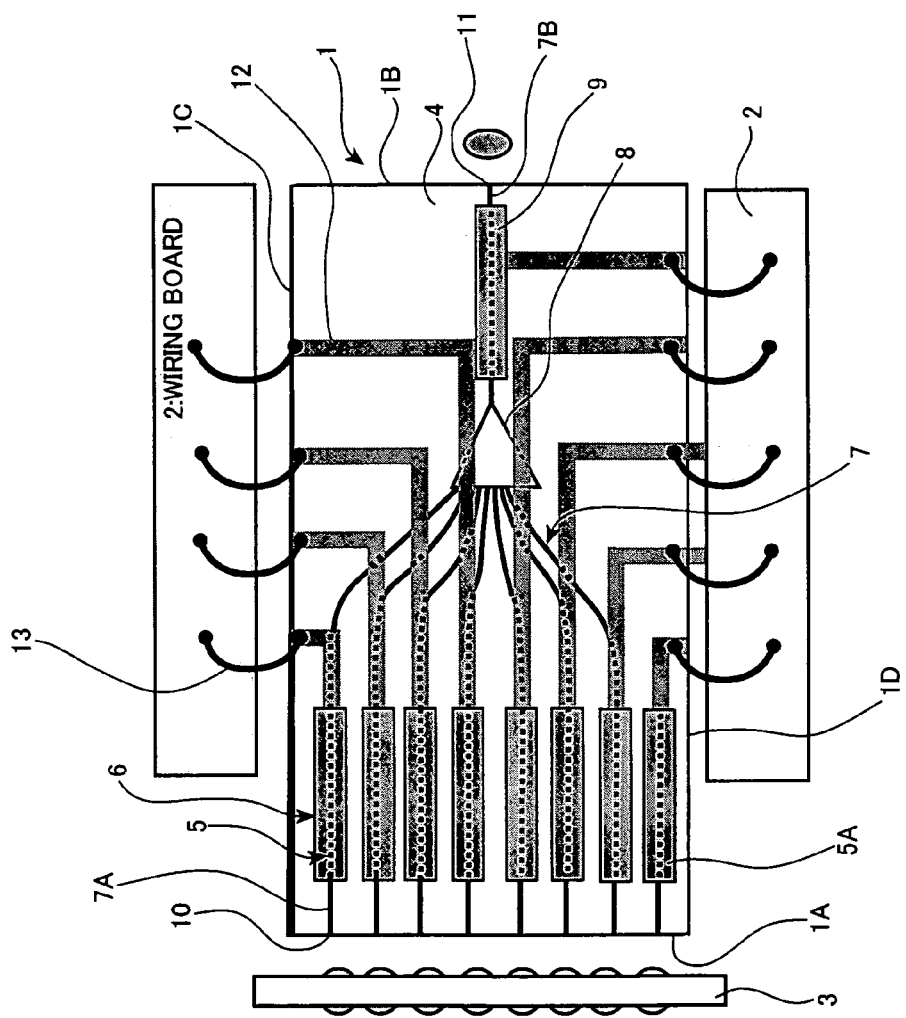
FIG. 1 is a schematic view showing a configuration of an optical integrated device (optical module) according to a first embodiment of the present invention.

For example, as shown in FIG. 1, the SOA gate array switch (optical module) according to the present embodiment is configured such that an SOA gate array integrated device (optical integrated device) 1, a wiring board 2 having a plurality of wirings and a lens array 3 formed from a plurality of lenses, all mounted on a mounting board (not shown).

Here, the SOA gate array integrated device 1 is formed by integrating an SOA gate array (optical switch device) 6 wherein a plurality of SOAs 5 (switching SOAs) are arranged in parallel to each other, an optical waveguide 7, an optical coupler 8, and an SOA 9 (amplifying SOA) for amplifying signal light (output signal light) to be outputted on a single semiconductor substrate 4 as shown in FIG. 1.

The optical waveguide 7 includes a plurality of input optical waveguides 7A connected to input ports 10 provided on one end face 1A and an output optical waveguide 7B connected to an output port 11. In the present embodiment, the output port 11 is provided on an end face 1B remote from (opposite to) the one end face 1A on which the input ports 10 are provided.

Further, as shown in FIG. 1, the plural SOAs 5 having electrodes 5A on the surface thereof are individually provided on the plural input optical waveguides 7A. Further, the SOA 9 is provided on the output optical waveguide 7B. Thus, output signal light is amplified by the SOA 9 provided on the output optical waveguide 7B and is outputted to an optical fiber or a silica glass type waveguide (not shown) optically connected to the output port 11. It is to be noted here that, while the SOA 9 is provided on the output optical waveguide 7B, the SOA 9 may not be provided.

The optical coupler 8 optically couples signal lights propagated along the plural input optical waveguides 7A to the output optical waveguide 7B.

In the present embodiment, as shown in FIG. 1, a plurality of signal lines 12 are formed on the surface of the SOA gate array integrated device 1 such that they are individually connected to the electrodes 5A of the plural SOAs 5 which form the SOA gate array 6. The signal lines 12 extend to side faces 1C and 1D which do not have any of the input ports 10 and the output port 11. In other words, the signal lines 12 are led out from the electrodes 5A of the SOAs 5 to the device side face (here, both side faces 1C and 1D). Therefore, the signal lines may be referred to also as led-out wirings.

It is to be noted here that, while the signal lines 12 extend from the electrodes 5A of the SOAs 5 to the opposite side faces 1C and 1D of the SOA gate array integrated device 1, the configuration of the signal lines is not limited to this, but, for example, the signal lines 12 may be configured so that they extend only to one side face of the device. In other words, the pattern (electrode pattern) of the electrodes 5A and the signal lines 12 may be changed arbitrarily only if the signal lines extend from the electrodes 5A of the SOAs 5 to the end face 1C or 1D which does not have any of the input ports 10 and the output port 11.

The wiring board 2 is arranged at a position opposed to an end face (here, the opposite side faces 1C and 1D) of the SOA gate array integrated device 1 which does not have any of the input ports 10 and the output port 11. Further, the plural signal lines 12 which are formed on the surface of the SOA gate array integrated device 1 and led out to the device side faces 1C and 1D and the plural wirings formed on the wiring board 2 are individually connected to each other by wires 13 of the same length.

In this manner, the lengths of the wires 13 can be made equal to each other and the difference between the lengths of the plural signal lines 12 formed on the surface of the device can be suppressed to a comparatively small value depending upon the design. Therefore, the variation in electric characteristic among electric wirings (signal lines and wires) connected to the electrodes 5A of the SOAs 5 can be suppressed to a level lower than that of the conventional technique as a whole.

Here, the SOAs 5 are electrically connected to the external wiring board 2 by the wires 13 through the signal lines 12 led out to the device side faces 1C and 1D. Therefore, the length of the wires 13 can be reduced and increase in inductance by the wires 13 can be suppressed.

Further, the lens array 3 is arranged at a position opposed to the one end face 1A of the SOA gate array integrated device 1 so that a plurality of lenses are optically connected to the plural input ports 10, respectively. Thus, signal lights propagated, for example, through a plurality of optical fibers which form an optical fiber array (or optical waveguides which form a silica glass type waveguide) and a plurality of lenses which form the lens array 3 are optically coupled (parallelly optically coupled) and inputted individually to the plural input ports 10 of the SOA gate array integrated device 1.

Now, a fabrication method for an optical integrated device (SOA gate array integrated device) according to the present embodiment is described with reference to FIGS. 2 and 3.

First, on an n type InP substrate 20, an n-InP cladding layer 21 (for example, of 200 nm thick), an i-InGaAsP lower SCH layer 22 (for example, of 100 nm thick), an i-InGaAsP active layer 23 (for example, of 50 nm thick, light emission wavelength: 1.55 μm), an i-InGaAsP upper SCH layer 24 (for example, of 100 nm thick), a p-InP cladding layer 25 (for example, of 200 nm thick) are epitaxially grown, for example, by a metal organic chemical vapor deposition (MOCVD) method.

Figure 2:
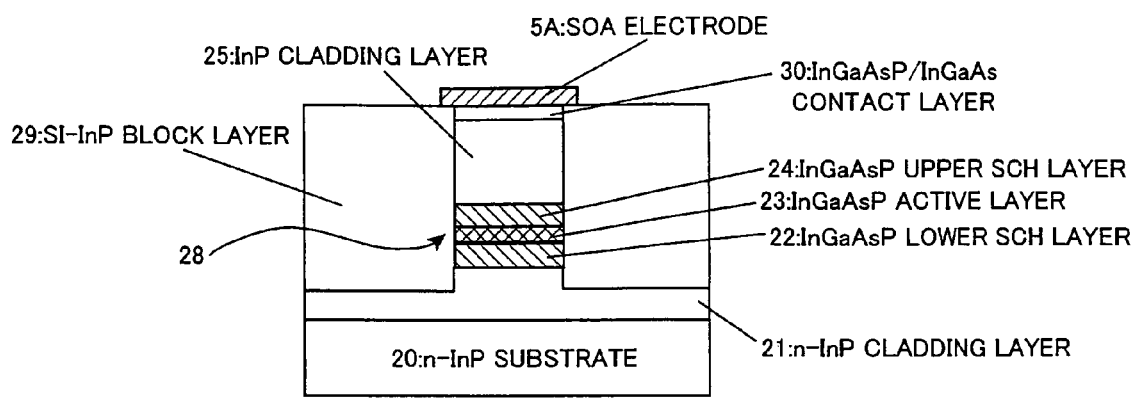
FIG. 2 is a schematic view illustrating a fabrication method for an optical integrated device (SOA gate array integrated device) according to the first embodiment of the present invention and is a sectional view showing an SOA region.

Then, an SiO$_2$ mask is formed only in an SOA gate array region (each of SOA regions), and the epitaxially grown layers from the p-InP cladding layer 25 to the i-InGaAsP lower SCH layer 22 in an optical waveguide region and an optical coupler region are removed, for example, by wet etching (refer to FIG. 2).

Figure 3:
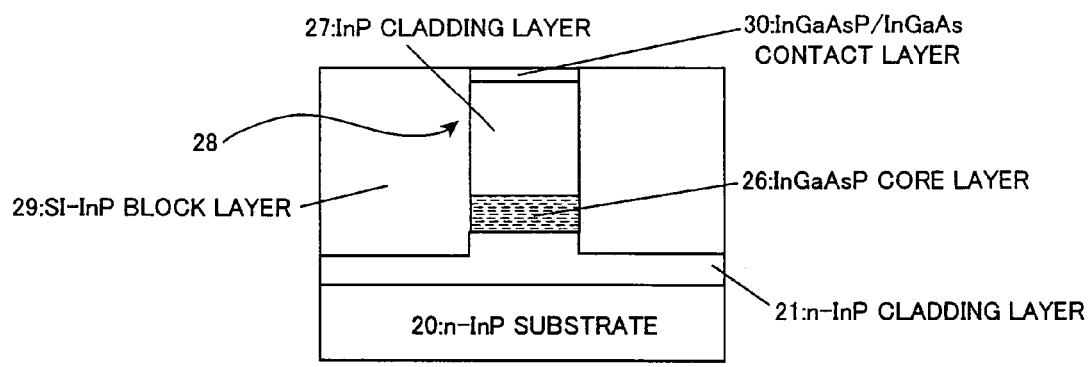
FIG. 3 is a schematic view illustrating the fabrication method for an optical integrated device (SOA gate array integrated device) according to the first embodiment of the present invention and is a sectional view showing an optical waveguide region or an optical coupler region.

Thereafter, in order to form the optical waveguide region and the optical coupler region using the SiO$_2$ mask, for example, by the MOVPE method, an i-InGaAsP core layer 26 (for example, 250 nm thick, light emission wavelength: 1.3 μm) and a p-InP cladding layer 27 (for example, of 200 nm thick) are butt joint grown (refer to FIG. 3).

Then, the SiO$_2$ mask is removed, and a p-InP cladding layer 25 (for example, of 1500 nm thick) and a contact layer 30 wherein an InGaAsP layer (for example, of 150 nm thick) and an InGaAsP layer (for example, of 300 nm thick) are laminated (stacked) in order are grown again on the overall face of the wafer, for example, by an MOVPE method.

Thereafter, an optical waveguide pattern (including the optical waveguide region, optical coupler region and SOA gate array region) is formed, for example, from SiO$_2$ on the surface of the wafer, and a waveguide mesa structure 28 having, for example, a height of approximately 3.0 μm is formed by a dry etching method such as, for example, an ICP-RIE (Inductively Coupled Plasma Reactive Ion Etching) method or the like using the formed optical waveguide pattern as a mask (refer to FIGS. 2 and 3).

Then, for example, a high-resistance InP buried layer [Si(Semi-Insulating)-InP block layer] 29 is deposited on the opposite side faces of the waveguide mesa structure 28 by an MOVPE method to form a current blocking structure by the high-resistance In P buried layer 29 (refer to FIGS. 2 and 3).

Thereafter, electrodes 5A having a structure similar to that of common semiconductor lasers are formed just on the active layer 23 of the SOAs 5 which form the SOA gate array 6 (refer to FIG. 2).

In the present embodiment, for example, as shown in FIG. 1, an SOA signal line pattern, for example, by gold plating is formed when the electrodes 5A are formed. In particular, a plurality of signal lines 12 are formed so as to be led out from the electrodes 5A of the SOAs 5 up to the device side faces 1C and 1D.

After the electrodes 5A and the signal lines 12 are formed in such a manner as described above, cutting out of a chip is performed by cleavage and anti-reflective coating is performed for end faces (end faces 1A and 1B which have the input ports and output port) which function as optical input-output sections in order to suppress ripples by end face reflection. Consequently, such an SOA gate array integrated device 1 as shown in FIG. 1 is fabricated.

Accordingly, with the optical integrated device and the optical module according to the present embodiment, there are advantages that increase of the inductance by the wires 13 can be suppressed and the variation in electric characteristic between electric wirings connected to the electrodes 5A of the SOAs 5 can be suppressed to a level lower than that of the conventional optical integrated device and optical module. Consequently, an SOA gate array switch can be implemented which can achieve both of good and uniform optical coupling characteristics and high-speed electric characteristics.

Second Embodiment

Now, an optical integrated device and an optical module according to a second embodiment of the present invention are described with reference to FIG. 4.

The optical integrated device (SOA gate array integrated device) and the optical module (SOA gate array switch) according to the present embodiment are different in the position of the output port, the shape of the output optical waveguide, the pattern shape of the signal lines, and the arrangement of the wiring board from those in the first embodiment.

In particular, in the present embodiment, the output optical waveguide 7B provided on the SOA gate array integrated device 1 is configured as an optical waveguide which includes a curved waveguide for guiding output signal light to the one end face 1A on which the input ports 10 are provided while changing the propagation direction of the output signal light by 180 degrees. Also, the output port 11 is provided on the one end face 1A of the SOA gate array integrated device 1 on which the input ports 10 are provided, and the input ports 10 and the output port 11 are arranged so as to line up in series along the one end face 1A. It is to be noted that, in FIG. 4, like elements to those in FIG. 1 (first embodiment described above) are denoted by like reference characters.

Figure 4:
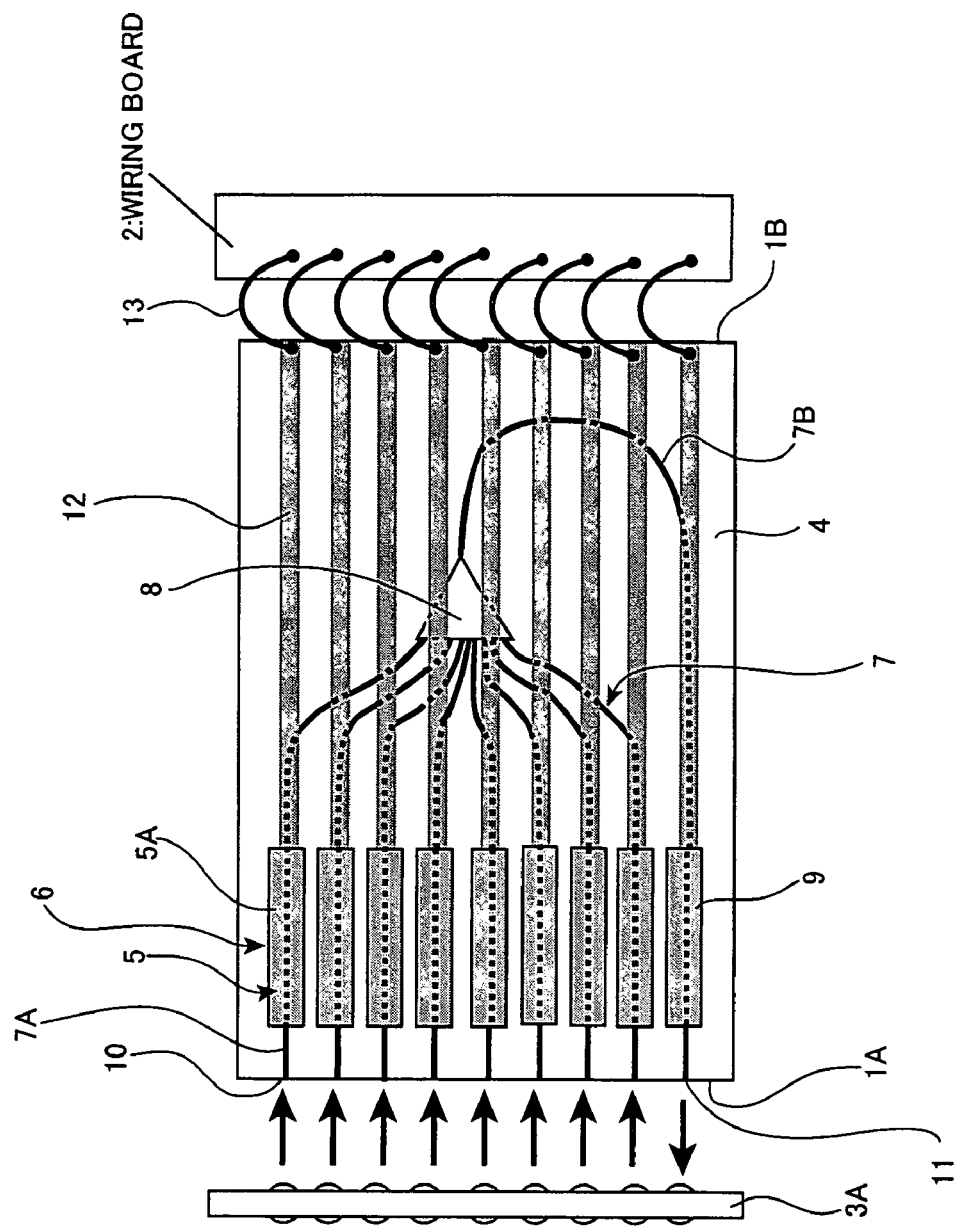
FIG. 4 is a schematic view showing a configuration of an optical integrated device (optical module) according to a second embodiment of the present invention.
Figure 5:
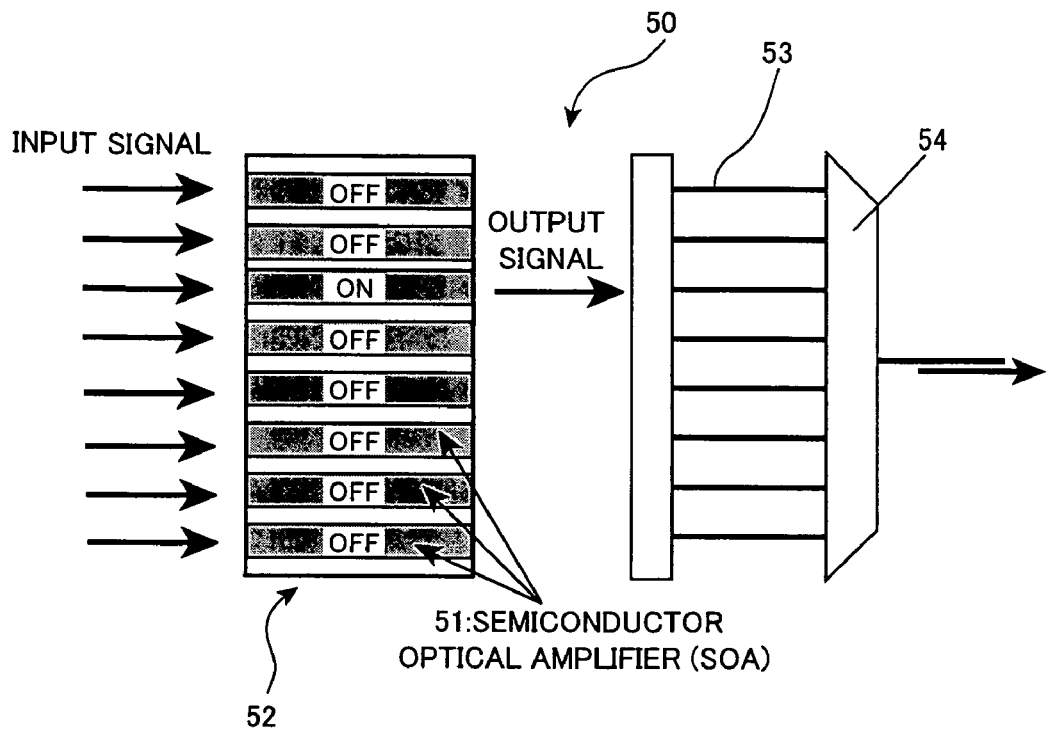
FIG. 5 is a schematic view showing a configuration of a conventional SOA gate array switch.
Figure 6:
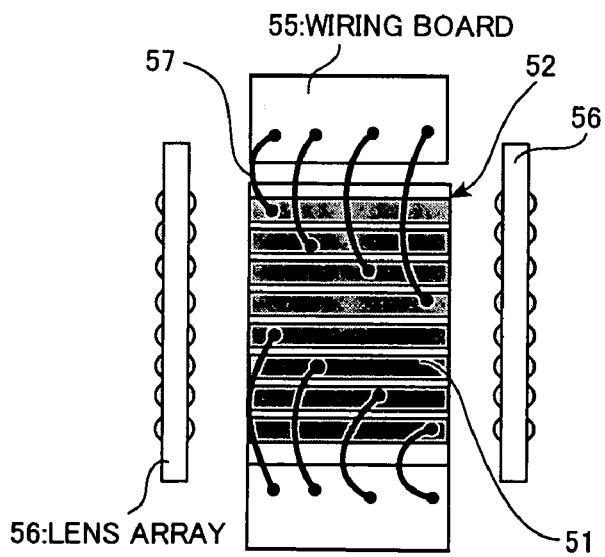
FIG. 6 is a schematic view illustrating a subject upon mounting of the conventional SOA gate array.

Therefore, as shown in FIG. 4, a lens array 3A is disposed at a position opposed to the one end face 1A of the SOA gate array integrated device 1 such that one of lenses which form the lens array 3A is optically connected to the output port 11 and the other lenses are optically connected to the input ports 10.

Then, lights inputted through the plural lenses which form the lens array 3A are optically coupled individually to the plural input ports 10 and outputted from the output port 11 through the single lens which is one of the lenses which form the lens array 3A. In other words, the single lens array 3A (or fiber array) is used to achieve full optical input-output coupling including optical coupling for inputting signal light and optical coupling for outputting signal light.

In this manner, in the present embodiment, the full optical coupling (that is, all optical connections) in the SOA gate array integrated device 1 is performed on the one end face 1A as shown in FIG. 4. Therefore, the one end face 1A of the SOA gate array integrated device 1 is referred to as optical input-output end face.

Further, in the present embodiment, the plural SOAs 5 (preceding stage SOAs) which form the SOA gate array 6 and are individually provided for the plural input optical waveguides 7A and the SOA 9 (following stage SOA) provided for the output optical waveguide 7B are arranged so as to line up in series along the one end face 1A of the SOA gate array integrated device 1. In other words, the preceding stage SOAs 5 and the following stage SOA 9 arranged in series on the propagation paths of signal light are arranged so as to line up in parallel along the device longitudinal direction (in other words, in series along the device widthwise direction).

As described above, the full optical coupling is performed on the one end face 1A of the SOA gate array integrated device 1, and electrical connection between the SOA gate array integrated device 1 and the wiring board 2 on the end face 1B remote from (opposite to) the one end face 1A of the SOA gate array integrated device 1 is performed while decreasing optical coupling portions of a module as shown in FIG. 4 in comparison with the conventional technique. Consequently, interference between the wires 13 and the lens array 3A can be suppressed.

Therefore, in the present embodiment, the wiring board 2 is disposed at a position opposed to the end face 1B remote from (opposite to) the one end face 1A of the SOA gate array integrated device 1 as shown in FIG. 4.

Further, in the present embodiment, the plural signal lines 12 are formed on the surface of the SOA gate array integrated device 1 and linearly extend from the electrodes 5A of the SOAs 5 to the end face 1B (end face which does not have any of the input ports 10 and the output port 11) remote from (opposite to) the one end face 1A (optical input-output end face). In other words, the signal lines 12 are formed in parallel linear patterns. In this instance, the signal lines 12 are equal in length, and the electrode and signal line patterns formed on the device surface are used commonly.

Further, the plural signal lines 12 led out from the electrodes 5A of the SOAs 5 to the end face 1B remote from (opposite to) the optical input-output end face 1A and the plural wirings formed on the wiring board 2 are connected to each other by the wires 13 of an equal length.

In the present embodiment, since the lengths of the electric wirings (signal lines and wires) connected to the electrodes 5A of the SOAs 5 are equal to each other, the variation in electric characteristic between the electric wirings can be suppressed to a very low level.

It is to be noted that, since details of the configuration of the remaining part and the fabrication method of the optical integrated device and optical module are the same as those in the first embodiment described above, description of them is omitted herein to avoid redundancy. It is to be noted that, in order to fabricate the SOA gate array integration device 1 according to the present embodiment, the waveguide pattern and the SOA electrode pattern should be changed in the fabrication method of an SOA gate array integrated device in the first embodiment described above.

Accordingly, with the optical integration device and the optical module according to the present embodiment, there are advantages that increase of the inductance by the wires 13 can be suppressed and the variation in electric characteristic between the electric wirings connected to the electrodes 5A of the SOAs 5 can be suppressed to a level lower than that of the conventional optical integration device and optical module similarly to those in the first embodiment described above. Consequently, an SOA gate array switch can be implemented which can achieve both of good and uniform optical coupling characteristics and high-speed electric characteristics.

[Others]

It is to be noted that, while, in the embodiments described, a configuration having a semi-insulating buried heterostructure (SI-BH) by a high-resistance InP buried layer 29 is described as an example of a current blocking structure, the structure of the current blocking portion is not limited to this. For example, a current blocking structure such as a pn buried heterostructure (pn-BH), a ridge structure, a semi-insulating planar buried heterostructure (SI-PBH) and so forth may be used, and also in this instance, a device having effects similar to those of the devices in the embodiments described above can be fabricated.

Also for the structure of the optical waveguide or the optical coupler, a high mesa structure and so forth can be adopted in addition to the structures described hereinabove. For example, if a high mesa structure is adopted, then an optical waveguide having a great curvature can be implemented.

Further, while, in the embodiments described above, an i-InGaAsP active layer is used as the active layer 23 of the SOAs 5, the active layer 23 is not limited to this. In particular, for example, the material or composition, thickness and so forth of the active layer 23 may be changed, or an MQW (Multiple Quantum Well) structure, a quantum dot structure or a like structure may be adopted to add various functions to the active layer 23. Also in those instances, a device having similar effects can be fabricated. Similarly, the optical waveguide and the core structure of the optical coupler are not limited to those in the embodiments described above.

The present invention is not limited to the embodiments specifically described above, and variations and modifications can be made without departing from the scope of the present invention.

What is claimed is:

1. An optical integrated device, comprising:
   a plurality of input optical waveguides connected respectively to a plurality of input ports provided on an end face of said optical integrated device;
   a single output optical waveguide connected to an output port;
   an optical coupler for optically coupling signal lights propagated along said plural input optical waveguides to said single output optical waveguide;
   a semiconductor optical amplifier gate array formed from a plurality of semiconductor optical amplifiers provided on said input optical waveguides, respectively, and each having an electrode on the surface thereof; and
   a plurality of signal lines formed on the surface of said optical integrated device in such a manner as to extend from said electrodes to a face of said optical integrated device on which none of said input ports and said output port is provided.

2. The optical integrated device as claimed in claim 1, wherein said output port is provided on an end face of said optical integrated device opposite to the end face on which said input ports are provided.

3. The optical integrated device as claimed in claim 1, wherein said output optical waveguide includes a curved waveguide,
   said input ports and said output port being provided in such a manner as to line up in series along the end face, wherein said signal lines have an equal length and the face of said optical integrated device on which none of said input ports and said output port is provided is opposite to the end face.

4. The optical integrated device as claimed in claim 1, further comprising a semiconductor optical amplifier provided on said output optical waveguide, for amplifying output signal light.

5. The optical integrated device as claimed in claim 2, further comprising a semiconductor optical amplifier provided on said output optical waveguide, for amplifying output signal light.

6. The optical integrated device as claimed in claim 3, further comprising a semiconductor optical amplifier provided on said output optical waveguide, for amplifying output signal light.

7. An optical module, comprising:
   the optical integrated device as claimed in claim 1;
   a lens array formed from a plurality of lenses; and
   a wiring board having a plurality of wirings thereon;
   said lens array being arranged at a position opposed to the end face of said optical integrated device such that said lenses are optically connected to said input ports, respectively;
   said wiring board being arranged at a position opposed to the face of said optical integrated device on which none of said input ports and said output port is provided.

8. An optical module, comprising:
   the optical integrated device as claimed in claim 2;
   a lens array formed from a plurality of lenses; and
   a wiring board having a plurality of wirings thereon;
   said lens array being arranged at a position opposed to the end face of said optical integrated device such that said lenses are optically connected to said input ports, respectively;
   said wiring board being arranged at a position opposed to the face of said optical integrated device on which none of said input ports and said output port is provided.

9. An optical module, comprising:
   the optical integrated device as claimed in claim 4;
   a lens array formed from a plurality of lenses; and
   a wiring board having a plurality of wirings thereon;
   said lens array being arranged at a position opposed to the end face of said optical integrated device such that said lenses are optically connected to said input ports, respectively;
   said wiring board being arranged at a position opposed to the face of said optical integrated device on which none of said input ports and said output port is provided.

10. An optical module, comprising:
    the optical integrated device as claimed in claim 3;
    a lens array formed from a plurality of lenses; and
    a wiring board having a plurality of wirings thereon;
    said lens array being arranged at a position opposed to the end face of said optical integrated device such that one of said lenses which form said lens array is optically connected to said single output port and the lenses other than the one lens are optically connected to said input ports, respectively;
    said wiring board being arranged at a position opposed to a face of said optical integrated device opposite to the end face.

11. An optical module, comprising:
    the optical integrated device as claimed in claim 6;
    a lens array formed from a plurality of lenses; and
    a wiring board having a plurality of wirings thereon;
    said lens array being arranged at a position opposed to the end face of said optical integrated device such that one of said lenses which form said lens array is optically connected to said single output port and the lenses other than the one lens are optically connected to said input ports, respectively;
    said wiring board being arranged at a position opposed to a face of said optical integrated device opposite to the end face.

* * * * *